United States Patent
Tseng

(10) Patent No.: US 8,483,325 B2
(45) Date of Patent: Jul. 9, 2013

(54) SISO DECODER FOR A BLOCK CODE

(75) Inventor: Chun-Chieh Tseng, Gueishan Township, Taoyuan County (TW)

(73) Assignee: Sunplus Technology Co., Ltd. (TW)

( * ) Notice: Subject to any disclaimer, the term of this patent is extended or adjusted under 35 U.S.C. 154(b) by 354 days.

(21) Appl. No.: 12/929,434

(22) Filed: Jan. 25, 2011

(65) Prior Publication Data

US 2012/0076247 A1 Mar. 29, 2012

(30) Foreign Application Priority Data

Sep. 24, 2010 (TW) .............................. 99132374 A

(51) Int. Cl.
*H04L 27/06* (2006.01)
(52) U.S. Cl.
USPC ........................... 375/340; 375/261; 375/265
(58) Field of Classification Search
USPC .................. 375/261, 265, 340, 341
See application file for complete search history.

(56) References Cited

U.S. PATENT DOCUMENTS

| | | | | |
|---|---|---|---|---|
| 2007/0041475 | A1* | 2/2007 | Koshy et al. | 375/340 |
| 2009/0141835 | A1* | 6/2009 | Yang et al. | 375/341 |
| 2010/0310019 | A1* | 12/2010 | Sadr | 375/341 |
| 2011/0173507 | A1* | 7/2011 | Wong et al. | 714/746 |

* cited by examiner

*Primary Examiner* — David B. Lugo
(74) *Attorney, Agent, or Firm* — Bacon & Thomas, PLLC

(57) ABSTRACT

A soft-in-soft-out (SISO) decoder for a general block code includes a source bit generator which generates k guessed source bits; a channel encoder which maps the k guessed source bits to an n-bit channel codeword; a QAM symbol mapper which generates a locally generated symbol sequence comprising m consecutive QAM symbols based on the n-bit channel codeword; a correlator which receives a symbol sequence, a channel state information sequence, and the locally generated symbol sequence to calculate a correlation associated with the received symbol sequence based on the received symbol sequence, the channel state information sequence, and the locally generated symbol sequence; and a log-likelihood ratio calculator which is connected to the source bit generator and the correlator to thereby calculate the required log-likelihood ratios associated with all coded bits corresponding to the received symbol sequence.

17 Claims, 8 Drawing Sheets

SISO DECODER FOR A BLOCK CODE

BACKGROUND OF THE INVENTION

1. Field of the Invention

The present invention relates to the technical field of general communication and, more particularly, to a soft-in-soft-out (SISO) decoder for a general block code.

2. Description of Related Art

Robust and efficient wideband communication is a challenge especially over adverse channels at either single carrier mode or multi-carrier mode of operations. In those communication systems that encounter huge transmission losses and/or require high sensitivity, such as the terrestrial applications that experience severe multipath fading and possible strong interferences, a cascaded forward error correction (FEC) scheme is usually used to provide high decoding gain in order to compensate any possible sources of loss. Toward this end in such scheme, inner decoder usually provides soft information, instead of a hard decision, associated with each coded bit to outer decoder. Those decoders that accept soft information at input and is able to provide outer decoder at with the soft information associated with each coded bit is called a soft-input-soft-output (SISO) decoder. In this invention, a simple and generic SISO decoder for (n, k) block code is proposed.

FIG. 1 is an equivalent block diagram of a general communication system that employs a cascaded coding scheme. At the transmitter site, a source bit sequence is passed through an outer encoder 110. The inner encoder 120 encodes a sequence out of the outer encoder 110. Then, the resulted coded bit stream from inner encoder is mapped to a sequence of QAM symbols by a QAM symbol mapper 125 and finally, the mapped QAM symbol sequence is sent over a communication channel 130.

At the receiving site, assuming perfect synchronization and channel estimation, an inner decoder 140 that acts as counterpart of inner encoder 120 is supposed to decode a block of received QAM symbols out of communication channel 130. In corresponding to the block of received QAM symbols, inner decoder 140 provides the outer decoder with decisions associated with all corresponding source bits encoded by inner encoder 120. The outer decoder 150 receives these decisions and performs a decoding process that acts as counterpart of outer encoder 110 to thereby generate the decoded bit sequence that serves as estimation of the source bit sequence at the input of outer encoder 110.

To achieve high decoding performance, most of commonly used outer codes in communication systems nowadays, such as popular turbo code or low density parity check code (LDPC), require input in the form of soft information. Therefore, it becomes imperative and highly demanded to design a simple and robust SISO inner decoder for a high quality receiver. On performing a soft decision decoding after perfect synchronization is achieved and perfect channel estimation is available, each received QAM symbol can be safely modeled by Gaussian distribution. Owing to the exponential nature of its probability density function (PDF), the soft information in the form of log likelihood ratio associated with each coded bit is commonly used to thereby simplify the computational complexity.

Though design of a SISO decoder for a general block code has been discussed in open literatures and prior arts, they are either complicated or incomplete. Therefore, it is desirable to provide a simple, robust and generic SISO decoder to mitigate and/or obviate the existing problems.

SUMMARY OF THE INVENTION

The object of the present invention is to provide a simple, robust and generic method to calculate the required log likelihood ratios in a SISO decoder for a general (n, k) block code. The proposed solution is general as it can be used for either linear or nonlinear block code modulated by any forms of QAM (Quadrature Amplitude Modulation) and is regardless of code properties.

Without loss of generality and for ease of description, design philosophy is illustrated by an exemplary Digital Television Terrestrial Multimedia Broadcasting (DTMB) system. One of operation modes in DTMB employs a cascaded coding scheme where NR code (Nordstrom-Robinson code) is the inner code and LDPC code is the outer code. The resulted coded bits after inner encoding are mapped to QAM symbols by 4-QAM modulation scheme.

The Nordstrom-Robinson (NR) code is a systematic (16,8) nonlinear block code. An NR encoder maps a block of eight source bits $a_0 \ldots a_7$ into a channel codeword that comprises 16 bits $a_0 \ldots a_7 e_0 \ldots e_7$ with $e_0 \ldots e_7$ being the redundant bits.

In accordance with a feature of the invention, a SISO decoder for a general block code is provided, which is used in a receiver of a general communication system. The SISO decoder includes a source bit generator, a channel encoder, a QAM symbol mapper, a correlator, and a log likelihood ratio (LLR) calculator. The source bit generator generates k guessed source bits, where k is a positive integer. The channel encoder is connected to the source bit generator in order to generate an n-bit channel codeword based on the k guessed source bits, where n is a positive integer. The QAM symbol mapper is connected to the channel encoder in order to generate a locally generated symbol sequence comprising m consecutive QAM symbols based on the n-bit channel codeword. The correlator is connected to the QAM symbol mapper in order to receive a symbol sequence, a channel state information sequence, and a locally generated symbol sequence produced by the QAM symbol mapper and thereby to calculate a correlation associated with the received symbol sequence. The log-likelihood ratio calculator is connected to the source bit generator and the correlator in order to calculate the required log-likelihood ratios associated with all coded bits corresponding to the received symbol sequence. In DTMB, the mentioned channel encoder is the (16,8) NR encoder and a QAM mapper generates consecutive eight 4-QAM symbols based on a 16-bit codeword. Therefore, n=16, k=8 and m=8 in this specific example.

In accordance with another feature of the invention, a soft-in-soft-out (SISO) decoder for a general block code is provided, which is used in a receiver of a general communication system. The SISO decoder includes a source bit generator, a channel encoder, a QAM symbol mapper, a distance calculator, and a log likelihood ratio (LLR) calculator. The source bit generator produces k guessed source bits, where k is a positive integer. The channel encoder is connected to the source bit generator in order to generate an n-bit channel codeword based on the k guessed source bits, where n is a positive integer. The QAM symbol mapper is connected to the channel encoder in order to generate a locally generated symbol sequence comprising m consecutive QAM symbols based on the n-bit channel codeword, where m is a positive integer. The distance calculator is connected to the QAM symbol mapper in order to receive a symbol sequence, a channel state information sequence, and a locally generated symbol sequence provided by the QAM symbol mapper and thereby to calculate a distance associated with the received symbol sequence. The log-likelihood ratio calculator is connected to the source bit generator and the distance calculator in order to calculate the required log-likelihood ratios associated with all coded bits corresponding to the received symbol sequence.

In accordance with a further feature of the invention, a soft-in-soft-out (SISO) decoder for a general block code is provided, which is used in a receiver of a general communication system. The SISO decoder includes a source bit generator, a correlator, and a log likelihood ratio (LLR) calculator. The source bit generator produces k guessed source bits, where k is a positive integer. The correlator receives a symbol sequence, a channel state information sequence, and a locally generated symbol sequence corresponding to the k guessed source bits to calculate a correlation associated with the received symbol sequence based on the received symbol sequence, the channel state information sequence, and the locally generated symbol sequence. The log-likelihood ratio calculator is connected to the source bit generator and the correlator in order to calculate the required log-likelihood ratios associated with all coded bits corresponding to the received symbol sequence. To be detailed shortly, a log-likelihood ratio LLR(b) can be approximated by the following equations:

$$LLR(b_i) \approx \min_{C \in C_i^0} \xi^{(i,0)} - \min_{C \in C_i^1} \xi^{(i,1)} = \frac{1}{\sigma^2} \{D_{mp}^{(i,1)} - D_{mp}^{(i,0)}\} = D_{md}^{(i,0)} - D_{md}^{(i,1)},$$

where $b_i$ denotes the i-th source bit of a source bit sequence $B \equiv (b_1, b_2, b_3, \ldots, b_8)$ and $b_i = b$ is zero or one.

$$D_{md}^{(i,b)} \equiv \min_{C \in C_i^b} \xi^{(i,b)},$$

$$D_{mp}^{(i,b)} \equiv \max_{C \in C_i^b} \left[ \sum_{n=1}^{8} |H_n| \cdot Re(\tilde{z}_n \cdot x_n^{(i,b)}) \right],$$

$C \equiv R(B)$ denotes a channel codeword obtained by mapping the source bit sequence B through a mapping function R of NR coding. $C_i^b \equiv \{C | B = R^{-1}(C), b_i = b\}$. $R^{-1}$ denotes a de-mapping function serving as inverse mapping function of R.

$$\xi^{(i,b)} \equiv \beta - \frac{1}{\sigma^2} \sum_{n=1}^{8} |H_n| \cdot Re(\tilde{z}_n \cdot x_n^{(i,b)}).$$

β is a non-zero constant. $\tilde{z}_n \equiv z_n^* \cdot e^{j \angle H_n}$ denotes a received phase-equalized symbol. $z_n \equiv x_n \cdot H_n + n_n$ denotes a component of a received symbol sequence $Z \equiv (z_1, z_2, z_3, \ldots, z_8)$. $H_n$ denotes a component of a channel state information sequence $H \equiv (H_1, H_2, H_3, \ldots, H_8)$ which denotes an estimated channel gain sequence associated with symbols of the received symbol sequence Z. $x_n$ denotes a component of a transmitted symbol sequence $X \equiv (x_1, x_2, x_3, \ldots, x_8)$ obtained by mapping the channel codeword C through a mapping function of 4-QAM modulation and $n_n$ denotes a component of independent Gaussian noises with zero mean and variance $\sigma^2$.

In accordance with a further another feature of the invention, a soft-in-soft-out (SISO) decoder for a general block code is provided, which is used in a receiver of a general communication system. The SISO decoder includes a source bit generator, a distance calculator, and a log likelihood ratio (LLR) calculator. The source bit generator produces k guessed source bits, where k is a positive integer. The distance calculator receives a symbol sequence, a channel state information sequence, and a locally generated symbol sequence corresponding to the k guessed source bits to calculate a distance associated with the received symbol sequence based on received the symbol sequence, the channel state information sequence, and the locally generated symbol sequence. The log-likelihood ratio calculator is connected to the source bit generator and the distance calculator in order to calculate the required log-likelihood ratios associated with all coded bits corresponding to the received symbol sequence. To be detailed shortly, a log-likelihood ratio $LLR(b_i)$ can be approximated by the following equations:

$$LLR(b_i) \approx \min_{C \in C_i^0} \xi^{(i,0)} - \min_{C \in C_i^1} \xi^{(i,1)} = \frac{1}{\sigma^2} \{D_{mp}^{(i,1)} - D_{mp}^{(i,0)}\} = D_{md}^{(i,0)} - D_{md}^{(i,1)},$$

where $b_i$ denotes i-th source bit of a source bit sequence $B \equiv (b_1, b_2, b_3, \ldots, b_8)$. $b_i = b$ and is zero or one.

$$D_{md}^{(i,b)} \equiv \min_{C \in C_i^0} \xi^{(i,b)} \cdot D_{mp}^{(i,b)} \equiv \max_{C \in C_i^b} \left[ \sum_{n=1}^{8} |H_n| \cdot Re(\tilde{z}_n \cdot x_n^{(i,b)}) \right].$$

$C \equiv R(B)$ denotes a channel codeword obtained by mapping the source bit sequence B through a mapping function R of NR coding. $C_i^b \equiv \{C | B = R^{-1}(C), b_i = b\}$. $R^{-1}$ denotes a de-mapping function of R.

$$\xi^{(i,b)} \equiv \beta - \frac{1}{\sigma^2} \sum_{n=1}^{8} |H_n| \cdot Re(\tilde{z}_n \cdot x_n^{(i,b)}).$$

β is a non-zero constant. $\tilde{z}_n \equiv z_n^* \cdot e^{j \angle H_n}$ denotes a received phase-equalized symbol. $z_n \equiv x_n \cdot H_n + n_n$ denotes a component of a received symbol sequence $Z \equiv (z_1, z_2, z_3, \ldots, z_8)$. $H_n$ denotes a component of a channel state information sequence $H \equiv (H_1, H_2, H_3, \ldots, H_8)$ which denotes an estimated channel gain sequence associated with symbols of the received symbol sequence Z. $x_n$ denotes a component of a transmitted symbol sequence $X \equiv (x_1, x_2, x_3, \ldots, x_8)$ obtained by mapping the channel codeword C through a mapping function of 4-QAM modulation, and $n_n$ denotes a component of independent Gaussian noises with zero mean and variance $\sigma^2$.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
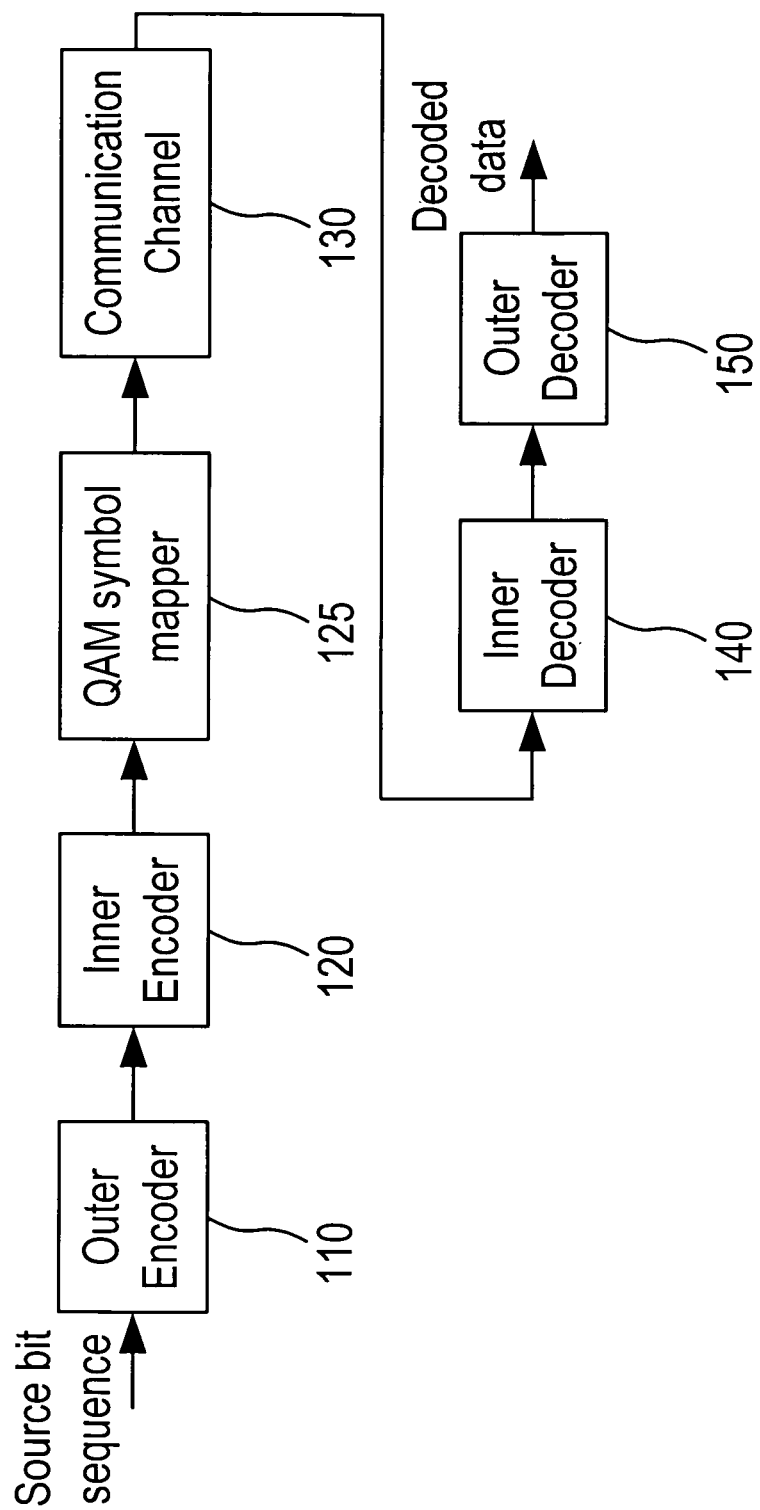
FIG. 1 is an equivalent block diagram of a general communication system employing a cascaded coding scheme.

In the invention, the soft-in-soft-out (SISO) decoder for a general block code applies the equations as detailed below. First, the equations for optimized soft information, i.e. the log likelihood ratios, are derived for a multi-carrier system operated under a general multipath channel. Then, similar derivations are applied to single carrier mode. At single carrier mode, symbols are transmitted in time domain. A perfect equalization is assumed to mitigate inter-symbol interferences before realizing this proposed LLR calculation.

Let $b_i$ denote an i-th source bit transmitted, Z denotes a received symbol sequence, and H denotes the corresponding channel state information sequence. The Log-Likelihood Ratio (LLR) associated with $b_i$ provided that H is perfectly known is defined as Equation (1):

$$LLR(b_i) = \ln\left\{\frac{P_r(b_i = 1 \mid Z, H)}{P_r(b_i = 0 \mid Z, H)}\right\}, \quad (1)$$

where $B \equiv (b_1, b_2, b_3, \ldots, b_8)$ and B denotes a source bit sequence.

By averaging over all possible channel codewords C, the two probabilities in Equation (1) can be simplified as Equation (2):

$$P_r(b_i = b \mid Z, H) = \sum_{C \in C_i^b} P_r(b_i = b \mid Z, C, H) \cdot P_r(C \mid Z, H) = \sum_{C \in C_i^b} P_r(C \mid Z, H) \quad (2)$$

where b=0 or 1, $C_i^b \equiv \{C \mid B = R^{-1}(C), b_i = b\}$, $C_i^b$ denotes a channel codeword generated from the source bit sequence B, $R^{-1}(\cdot)$ denotes a de-mapping function of Nordstrom-Robinson (NR) decoding, and the channel codeword $C \equiv R(B)$ is obtained by mapping the source bit sequence B through a mapping function of Nordstrom-Robinson (NR) coding. Since $P_r(b_i = b \mid Z, C, H) = 1$, the second equality in Equation (2) holds.

By Bayes' rule and due to the fact that the transmitted codewords are independent of the channel state information, $P_r(C \mid Z, H)$ in Equation (2) can be rewritten as:

$$P_r(C \mid Z, H) = P_r(Z \mid C, H) \cdot P_r(C \mid H) / P_r(Z \mid H) \quad (3)$$
$$= P_r(Z \mid C, H) \cdot P_r(C) / P_r(Z \mid H).$$

As the channel state information H and the transmitted channel codeword C are known, each received symbol sequence Z consists of eight independent QAM symbols each of them being all in Gaussian distribution. As such, the first conditional probability in Equation (3) can be rewritten as:

$$P_r(Z \mid C, H) = \prod_{n=1}^{8} f(z_n \mid x_n^{(i,b)}, H_n), \quad (4)$$

where $f(z_n \mid x_n^{(i,b)}, H_n)$ denotes a conditional probability density function of $z_n$ which denotes a component of a received QAM symbol sequence $Z \equiv (z_1, z_2, z_3, \ldots, z_8)$, $z_n \equiv x_n \cdot H_n + n_n$. $H_n$ denotes a component in channel state information sequence $H \equiv (H_1, H_2, H_3, \ldots, H_8)$ which represents the estimated channel gain sequence associated with the received symbol sequence Z, $x_n$ is a component of a transmitted QAM symbol sequence $X \equiv (x_1, x_2, x_3, \ldots, x_8)$, and $n_n$ is a component of independent Gaussian noises with zero mean and variance $\sigma^2$. Accordingly, the conditional pdf $f(z_n \mid x_n^{(i,b)}, H_n)$ can be expressed as:

$$f(z_n \mid x_n^{(i,b)}, H_n) = \frac{1}{\sqrt{2\pi}\,\sigma} \exp\left\{\frac{-|z_n - x_n^{(i,b)} \cdot H_n|^2}{2\sigma^2}\right\}. \quad (5)$$

Substituting into Equation (2) by Equation (3), Equation (4), and Equation (5) and assuming identical probability of each symbol transmission, the probability $P_r(C)$ and the channel codeword C are independent of each other. Therefore, $$\begin{aligned}
\xi^{(i,b)} &\equiv \frac{1}{2\sigma^2} \sum_{n=1}^{8} |z_n - x_n^{(i,b)} \cdot H_n|^2 \\
&= \frac{1}{2\sigma^2}\left\{\sum_{n=1}^{8} |z_n|^2 + \sum_{n=1}^{8} |x_n^{(i,b)}|^2 |H_n|^2 - 2\sum_{n=1}^{8} \operatorname{Re}(z_n^* \cdot z_n^{(i,b)} \cdot H_n)\right\} \\
&= \beta - \frac{1}{\sigma^2} \sum_{n=1}^{8} \operatorname{Re}(z_n^* \cdot x_n^{(i,b)} \cdot H_n) \\
&= \beta - \frac{1}{\sigma^2} \sum_{n=1}^{8} \operatorname{Re}(z_n^* \cdot x_n^{(i,b)} \cdot |H_n| \cdot e^{j\angle H_n}) \\
&= \beta - \frac{1}{\sigma^2} \sum_{n=1}^{8} |H_n| \cdot \operatorname{Re}(\tilde{z}_n \cdot x_n^{(i,b)}),
\end{aligned} \quad (6)$$

where k is a multiplicative factor that can be expressed as $$\frac{P_r(C)}{\sqrt{2\pi}\,\sigma \cdot P_r(Z \mid H)} \cdot \xi^{(i,b)}$$

and can be deduced in detailed as follows:

$$\begin{aligned}
\xi^{(i,b)} &\equiv \frac{1}{2\sigma^2} \sum_{n=1}^{8} |z_n - x_n^{(i,b)} \cdot H_n|^2 \\
&= \frac{1}{2\sigma^2}\left\{\sum_{n=1}^{8} |z_n|^2 + \sum_{n=1}^{8} |x_n^{(i,b)}|^2 |H_n|^2 - 2\sum_{n=1}^{8} \operatorname{Re}(z_n^* \cdot z_n^{(i,b)} \cdot H_n)\right\} \\
&= \beta - \frac{1}{\sigma^2} \sum_{n=1}^{8} \operatorname{Re}(z_n^* \cdot x_n^{(i,b)} \cdot H_n) \\
&= \beta - \frac{1}{\sigma^2} \sum_{n=1}^{8} \operatorname{Re}(z_n^* \cdot x_n^{(i,b)} \cdot |H_n| \cdot e^{j\angle H_n}) \\
&= \beta - \frac{1}{\sigma^2} \sum_{n=1}^{8} |H_n| \cdot \operatorname{Re}(\tilde{z}_n \cdot x_n^{(i,b)}),
\end{aligned} \quad (7)$$

where $\operatorname{Re}(\cdot)$ denotes the real part of a complex number.

We know from Equation (7) that both maximum correlation and minimum distance skills can be well applied to systems with constant amplitude modulation scheme. For non-constant amplitude modulation scheme, however, only the minimum distance skill is allowed. Maximum correlation skill in this case leads to error due to ignorance of non-constant terms in Equation (7). In any cases, this invention can be applied equally well to systems with either constant amplitude modulation scheme or non-constant amplitude modulation scheme.

In Equation (7), β is a non-negative constant independent of i and $b_i$. $\tilde{z}_n \equiv z_n * e^{j\angle H_n}$ is defined as a received phase-equalized symbol.

Substituting into Equation (1) by Equation (6) and Equation (7) and removing multiplicative factor k due to the log operation, Equation (1) can be rewritten as:

$$LLR(b_i) = \ln\left\{\frac{P_r(b_i = 1 \mid Z, H)}{P_r(b_i = 0 \mid Z, H)}\right\} \quad (8)$$

$$= \ln\left\{\sum_{C \in C_i^1} \exp[-\xi^{(i,1)}]\right\} - \ln\left\{\sum_{C \in C_i^0} \exp[-\xi^{(i,0)}]\right\}.$$

Since β is a non-negative constant, a log-sum approximation can be used to reduce the computation complexity. The log-sum approximation can be expressed as:

$$\ln\sum_j \exp(-y_j) \approx -\underset{j}{\mathrm{Min}}(y_j) \text{ if } y_j \geq 0, \quad (9)$$

where Min(·) denotes an operation of extraction of minimum.

From Equation (7) and Equation (9) and as β is eliminated, Equation (8) can be rewritten as:

$$LLR(b_i) \approx \underset{C \in C_i^0}{\mathrm{Min}} \xi^{(i,0)} - \underset{C \in C_i^1}{\mathrm{Min}} \xi^{(i,1)} \quad (10)$$

$$= \frac{1}{\sigma^2}\left\{\underset{C \in C_i^1}{\mathrm{Max}}\left[\sum_{n=1}^{8} \mathrm{Re}(z_n^* \cdot x_n^{(i,1)} \cdot H_n)\right] - \underset{C \in C_i^0}{\mathrm{Max}}\left[\sum_{n=1}^{8} \mathrm{Re}(z_n^* \cdot x_n^{(i,0)} \cdot H_n)\right]\right\}$$

$$= \frac{1}{\sigma^2}\left\{\underset{C \in C_i^1}{\mathrm{Max}}\left[\sum_{n=1}^{8} |H_n| \cdot \mathrm{Re}(\tilde{z}_n \cdot x_n^{(i,1)})\right] - \underset{C \in C_i^0}{\mathrm{Max}}\left[\sum_{n=1}^{8} |H_n| \cdot \mathrm{Re}(\tilde{z}_n \cdot x_n^{(i,0)})\right]\right\}$$

$$= \frac{1}{\sigma^2}\{D_{mp}^{(i,1)} - D_{mp}^{(i,0)}\}$$

$$= D_{md}^{(i,0)} - D_{md}^{(i,1)},$$

where $$D_{md}^{(i,b)} \equiv \underset{C \in C_i^b}{\mathrm{Min}} \xi^{(i,b)},$$

$$D_{mp}^{(i,b)} \equiv \underset{C \in C_i^b}{\mathrm{Max}}\left[\sum_{n=1}^{8} |H_n| \cdot \mathrm{Re}(\tilde{z}_n \cdot x_n^{(i,b)})\right],$$

and Max(·) denotes an operation of extraction of maximum.

In addition, $D_{md}^{(i,b)}$ denotes a minimum distance between the received phase-equalized symbols $\tilde{Z}$ and the guessed symbols $X^{(i,b)}$ weighted by channel state information H, or a maximal projection of the received phase-equalized symbols $\tilde{Z}$ on the guessed symbols $X^{(i,b)}$ weighted by H. The LLRs for $D_{md}^{(i,b)}$ can be obtained by searching 128 out of 256 candidate codewords. In Equation (10), whether the LLRs can be calculated by phase-equalized symbols or not is up to the availability of phase estimation and rotation device such as CORDIC.

Figure 2:
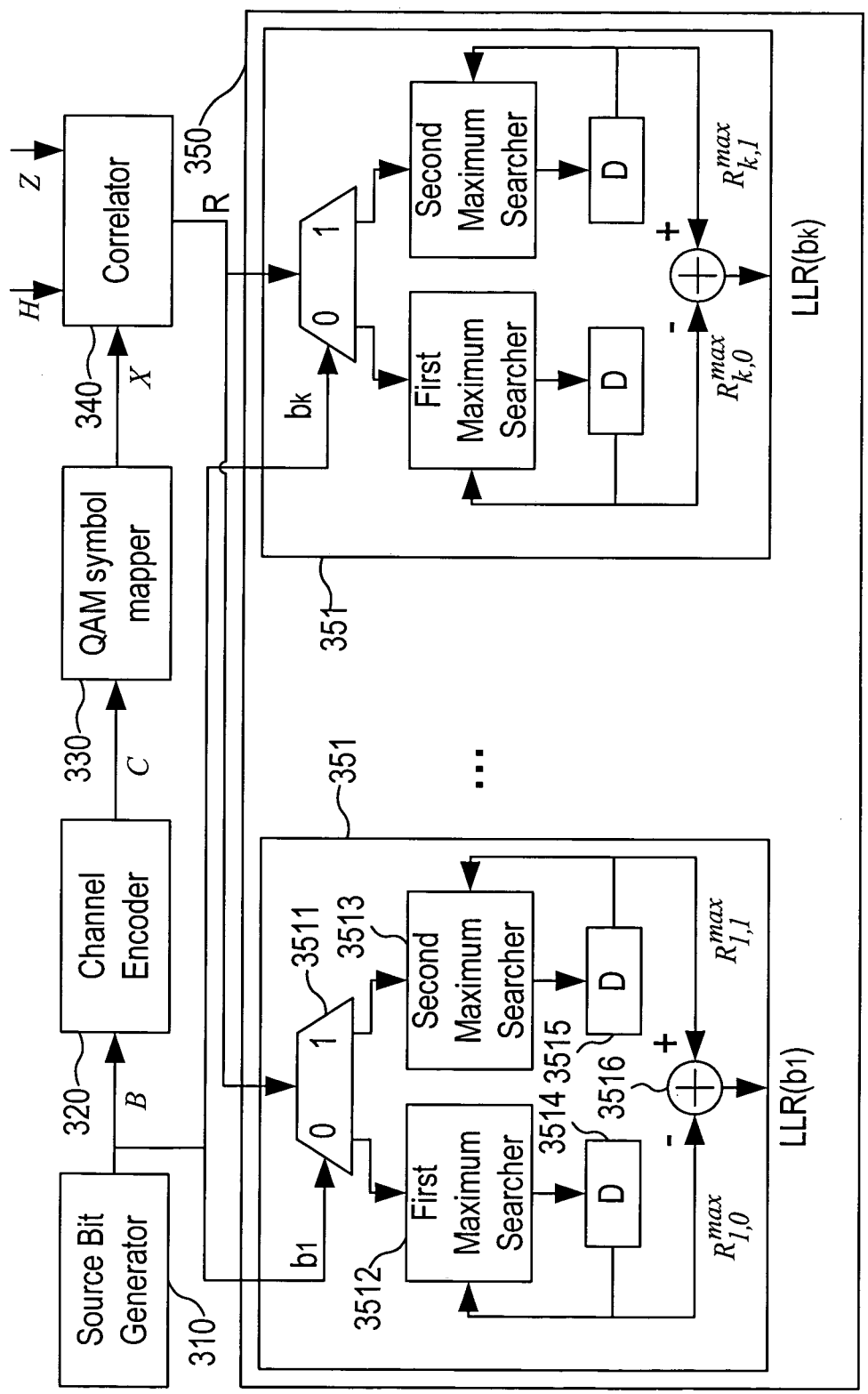
FIG. 2 is a block diagram of a SISO decoder for a general block code in accordance with an embodiment of the invention.

FIG. 2 is a block diagram of a soft-in-soft-out (SISO) decoder 300 for a general block code in accordance with an embodiment of the invention, which is essentially based on the maximal correlation in Equation (10) to calculate the LLRs. In FIG. 2, the SISO decoder 300 includes a source bit generator 310, a channel encoder 320, a QAM symbol mapper 330, a correlator 340, and a log likelihood ratio (LLR) calculator 350.

The source bit generator 310 generates k guessed source bits, where k is a positive integer. In an example using an NR codeword, the source bit generator 310 generates an 8-bit source bit sequence B, i.e., $B \equiv (b_1, b_2, b_3, \ldots, b_8)$.

The channel encoder 320 is connected to the source bit generator 310 in order to generate an n-bit channel codeword based on the k guessed source bits coded, where n is a positive integer. In this embodiment, the channel encoder 320 can be an NR (Nordstrom-Robinson) encoder. With the NR codeword, the channel encoder 320 can perform an NR coding on the 8-bit source bit sequence to thus generate a 16-bit NR codeword C, i.e., the channel codeword.

The QAM symbol mapper 330 is connected to the channel encoder 320 in order to map the n-bit channel codeword C into a locally generated symbol sequence comprising m consecutive QAM symbols X based on the n-bit channel codeword, where n, m are positive integers. The QAM symbol mapper 330 can be a constant amplitude mapper. In this embodiment, the QAM symbol mapper 330 is a 4-QAM mapper, but can be generalized to any kind of QAM modulation.

When the NR code and the 4-QAM modulation are used, the QAM symbol mapper 330 maps the 16-bit NR codeword C into eight 4-QAM, locally generated symbol sequences X.

The correlator 340 is connected to the QAM symbol mapper 330 in order to receive a received symbol sequence Z, a channel state information sequence H, and the locally generated symbol sequence X provided by the QAM symbol mapper 330 to calculate a correlation associated with the received symbol sequence Z based on the received symbol sequence Z, the channel state information H, and the locally generated symbol sequence X.

The log-likelihood ratio (LLR) calculator 350 is connected to the source bit generator 310 and the correlator 340 in order to calculate the required log-likelihood ratios associated with all coded bits corresponding to the received symbol sequence.

Figure 3:
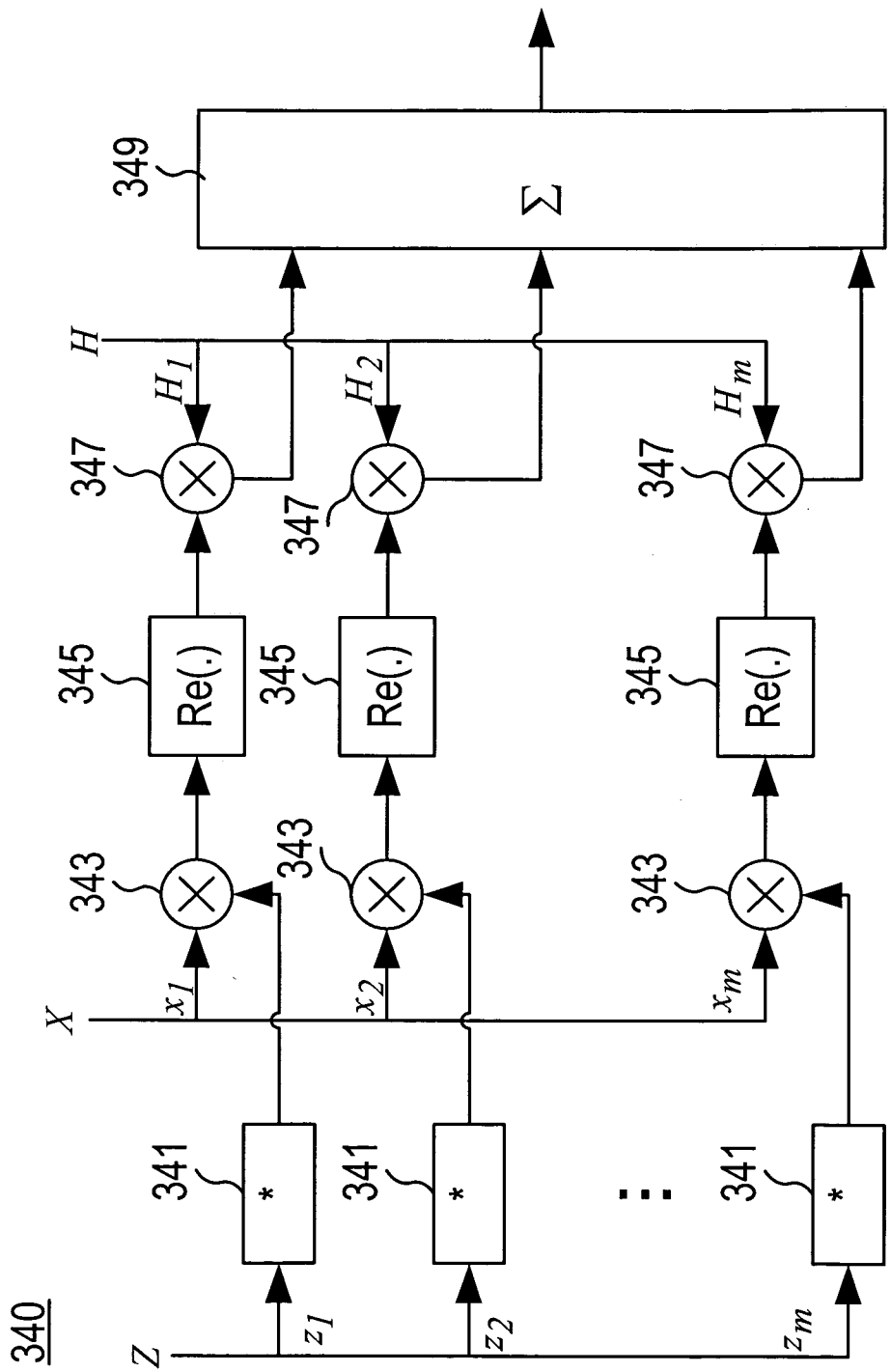
FIG. 3 is a block diagram of a correlator in accordance with an embodiment of the invention.

FIG. 3 is a block diagram of the correlator 340 in accordance with an embodiment of the invention. In FIG. 3, the correlator 340 includes m complex conjugate units 341, m first multipliers 343, m real number extractors 345, m second multipliers 347, and an integrator 349.

An m'-th complex conjugate unit 341 receives an m'-th component (the m'th received symbol) of the received symbol sequence Z and performs an operation of complex conjugate on the m'-th component, where m, m' are positive integers, and 1≦m'≦m.

An m'-th first multiplier 343 receives an output of the m'-th complex conjugate unit 341 and an m'-th component (the m'-th transmitted symbol) of the locally generated symbol sequence X and multiplies the output by the m'-th component.

An m'-th real number extractor 345 is connected to the m'-th first multiplier 343 in order to perform an operation of extraction of real number on the output of the m'-th first multiplier 343.

An m'th second multiplier 347 is connected to the m'-th real number extractor 345 and receives an m'-th component of the channel state information sequence H for performing a multiplication operation.

The integrator 349 is connected to the m second multipliers in order to perform an addition operation on the output of the m second multipliers to thereby generate the correlation associated with the received symbol sequence Z.

The LLR calculator 350 includes k sub-LLR calculators 351, each having a demultiplexer 3511, a first maximum searcher 3512, a first register 3514, a second maximum searcher 3513, a second register 3515, and a subtractor 3516.

A k'-th demultiplexer 3511 is connected to k'-th source bit generated by the source bit generator 310 and the correlator 340 in order to output the correlation corresponding to a k'-th source bit, where k, k' are positive integer, and $1 \leq k' \leq k$.

A k'-th first maximum searcher 3512 is connected to a first output terminal of the k'-th demultiplexer 3511 in order to search a maximum in the correlation.

A k'-th first register 3514 is connected to the k'-th first maximum searcher 3512 in order to temporarily store an output of the k'-th first maximum searcher 3512.

A k'-th second maximum searcher 3513 is connected to a second output terminal of the k'-th demultiplexer 3511 in order to search a maximum in the correlation.

A k'-th second register 3515 is connected to the k'-th second maximum searcher 3513 in order to temporarily store an output of the k'-th second maximum searcher 3513.

A k'-th subtractor 3516 is connected to the k'-th first register 3514 and the k'-th second register 3515 in order to subtract an output of the k'-th first register 3514 from an output of the k'-th second register 3515 to thereby generate a k'-th LLR. The output from the k'-th subtractor 3516 is the calculated LLR associated with the k'-th coded bit corresponding to the received symbol sequence Z.

This invention provides a simple and robust solution to calculate soft information in a SISO decoder. It can be applied to operations at either single carrier mode or multi-carrier mode over generic transmission channel. The target (n, k) block code suitable for the invention can be either a linear block or a nonlinear block code modulated by general QAM schemes with either constant amplitude or non-constant amplitude.

Figure 4:
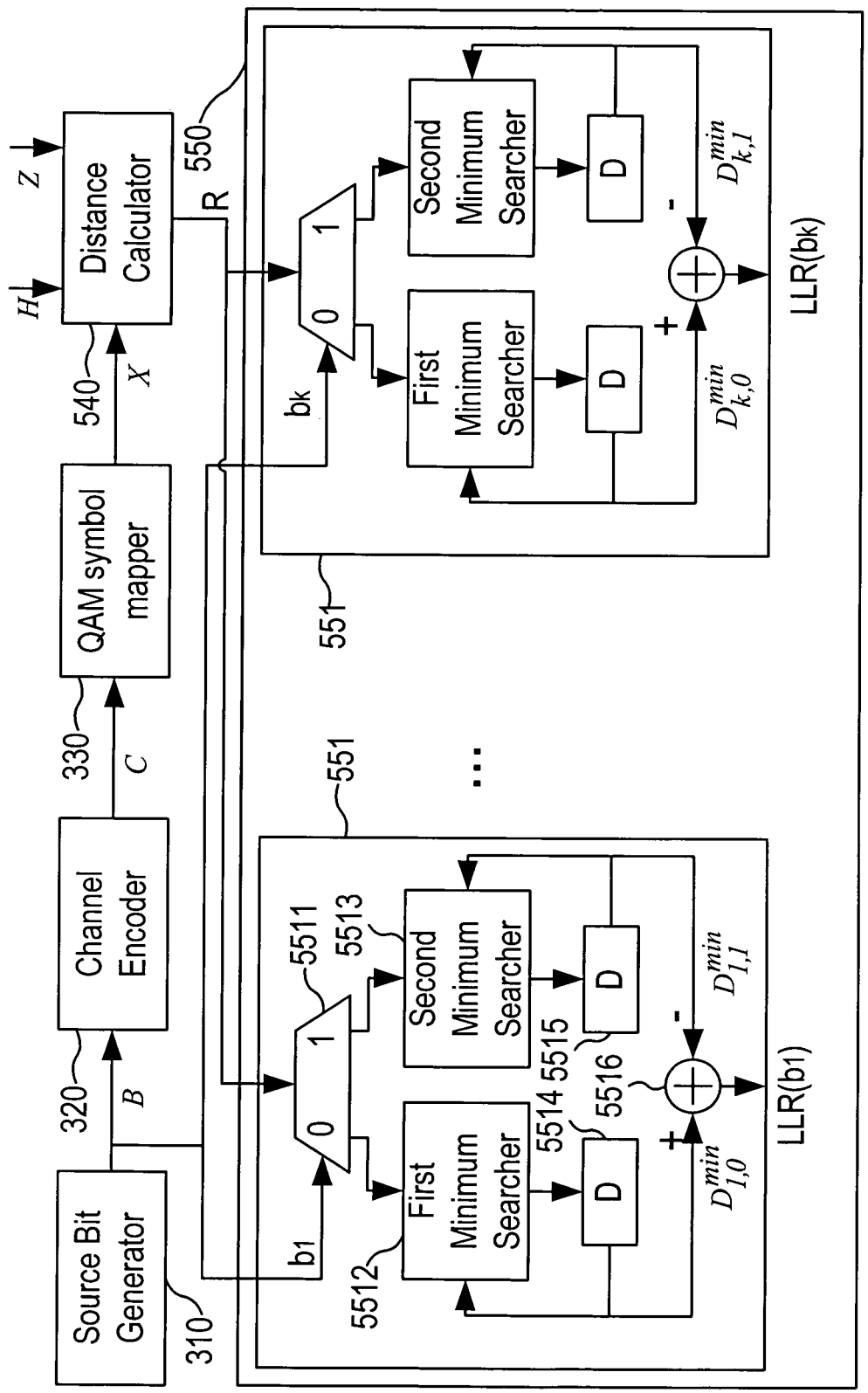
FIG. 4 is a block diagram of a SISO decoder for a general block code in accordance with another embodiment of the invention.

FIG. 4 is a block diagram of a SISO decoder 300 for a general block code in accordance with another embodiment of the invention. In this embodiment, the minimum distance in Equation (10) is used to calculate the LLRs. In FIG. 4, the SISO decoder 300 includes a source bit generator 310, a channel encoder 320, a QAM symbol mapper 330, a distance calculator 540, and an LLR calculator 550.

The source bit generator 310, the channel encoder 320, and the QAM symbol mapper 330 are identical to those of FIG. 3, so no more detail is described.

The distance calculator 540 is connected to the QAM symbol mapper 330 in order to receive a received symbol sequence Z, a channel state information sequence H, and a locally generated symbol sequence X provided by the QAM symbol mapper 330 and calculate a distance associated with the received symbol sequence Z based on the received symbol sequence Z, the channel state information sequence H, and the locally generated symbol sequence X.

The log-likelihood ratio (LLR) calculator 550 is connected to the source bit generator 310 and the distance calculator 540 in order to calculate the required log-likelihood ratios associated with all coded bits corresponding to the received symbol sequence.

The log-likelihood ratio (LLR) calculator 550 includes k sub-LLR calculators 551, each having a demultiplexer 5511, a first minimum searcher 5512, a first register 5514, a second minimum searcher 5513, a second register 5515, and a subtractor 5516.

A k'-th demultiplexer 5511 is connected to the source bit generator 310 and the distance calculator 540 in order to calculate the distance corresponding to a k'-th source bit, where k, k' are positive integers, and $1 \leq k' \leq k$.

A k'-th first minimum searcher 5512 is connected to a first output terminal of the k'-th demultiplexer 5511 in order to search a minimum in the distance.

A k'-th first register 5514 is connected to the k'-th first minimum searcher 5512 in order to temporarily store an output of the k'-th first minimum searcher 5512.

A k'-th second minimum searcher 5513 is connected to a second output terminal of the k'-th demultiplexer 5511 in order to search a minimum in the distance.

A k'-th second register 5515 is connected to the k'-th second minimum searcher 5513 in order to temporarily store an output of the k'-th second minimum searcher 5513.

A k'-th subtractor 5516 is connected to the k'-th first register 5514 and the k'-th second register 5515 in order to subtract an output of the k'-th first register 5515 from an output of the k'-th second register 5514 to thereby generate a k'-th LLR.

Figure 5:
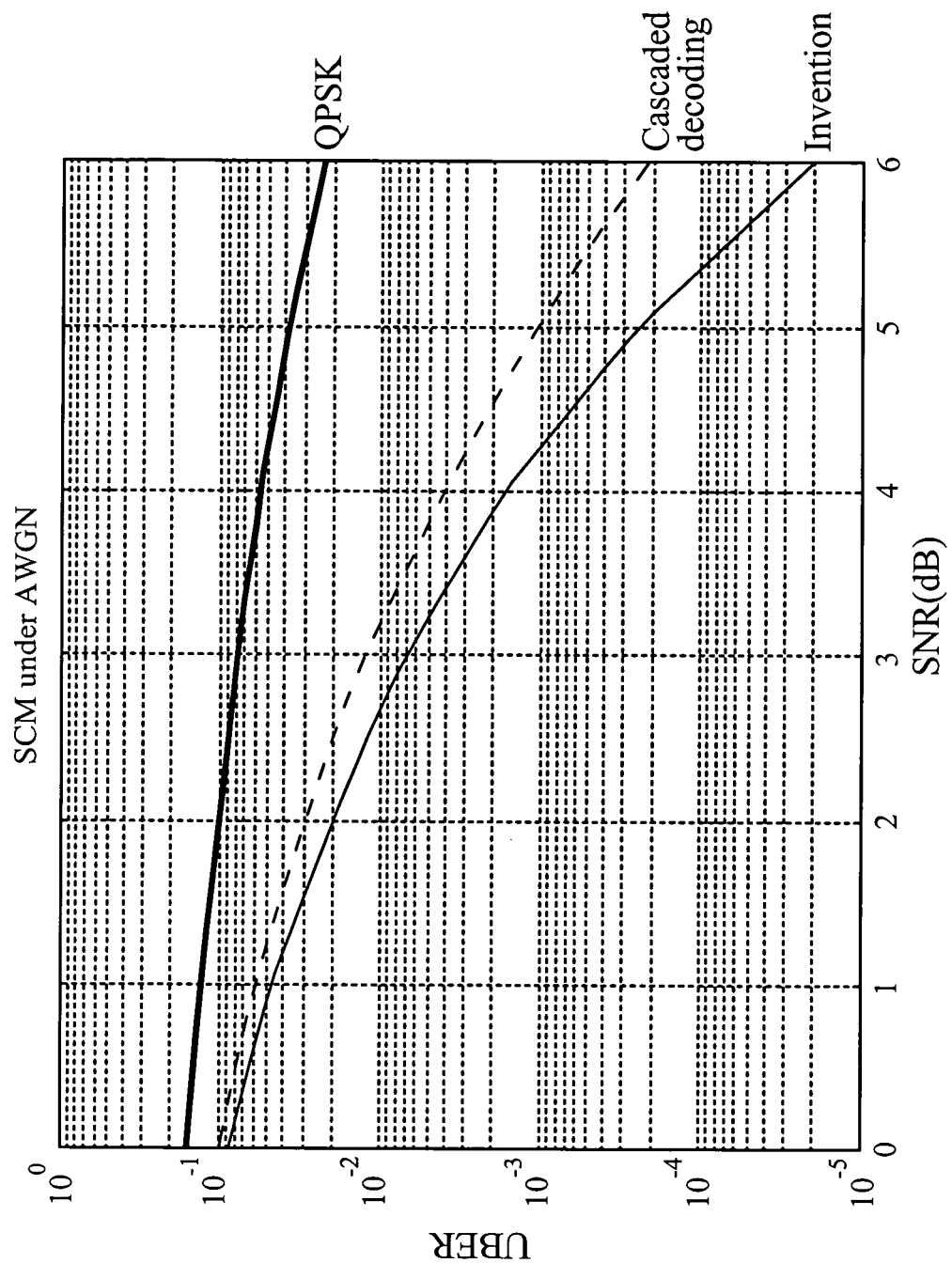
FIG. 5 a schematic graph of simulation result in accordance with the invention.

FIG. 5 is a schematic graph of simulation results in accordance with the invention, which is operated under additive white Gaussian noise (AWGN) channel at single carrier mode and QPSK modulation scheme with cascaded decoding. In FIG. 5, the vertical axis denotes an uncoded bit error rate (UBER), and the horizontal axis denotes a signal to noise ratio (SNR). As shown in FIG. 5, the dash line denoted as cascaded decoding is a simulation result of a technology that is disclosed in U.S. application Ser. No. 12/585,805, entitled "A decoding System for LDPC Code Concatenated with 4QAM-NR Code" filed Oct. 25, 2009.

Figure 6:
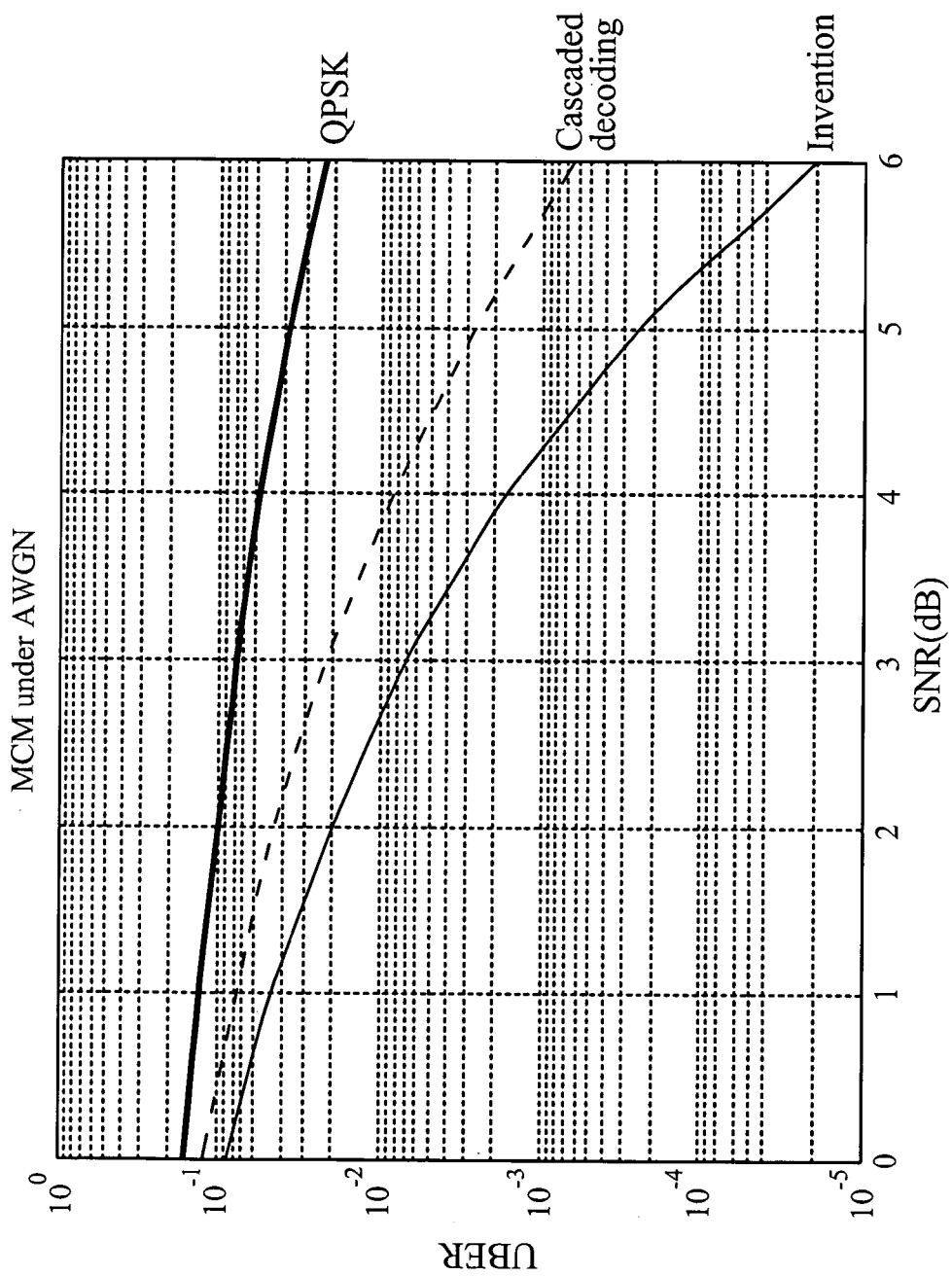
FIG. 6 a schematic graph of another simulation result in accordance with the invention.

FIG. 6 is a schematic graph of another simulation result in accordance with the invention, which is operated under additive white Gaussian noise (AWGN) channel at multi-carrier mode and typical QPSK modulation scheme with cascaded decoding. In FIG. 6, the vertical axis denotes uncoded bit error rate (UBER), and the horizontal axis denotes signal to noise ratio (SNR). The cascaded decoding dash line is a simulation result of a technology that is disclosed in U.S. application Ser. No. 12/585,805, entitled "A decoding System for LDPC Code Concatenated with 4QAM-NR Code" filed Oct. 25, 2009.

Figure 7:
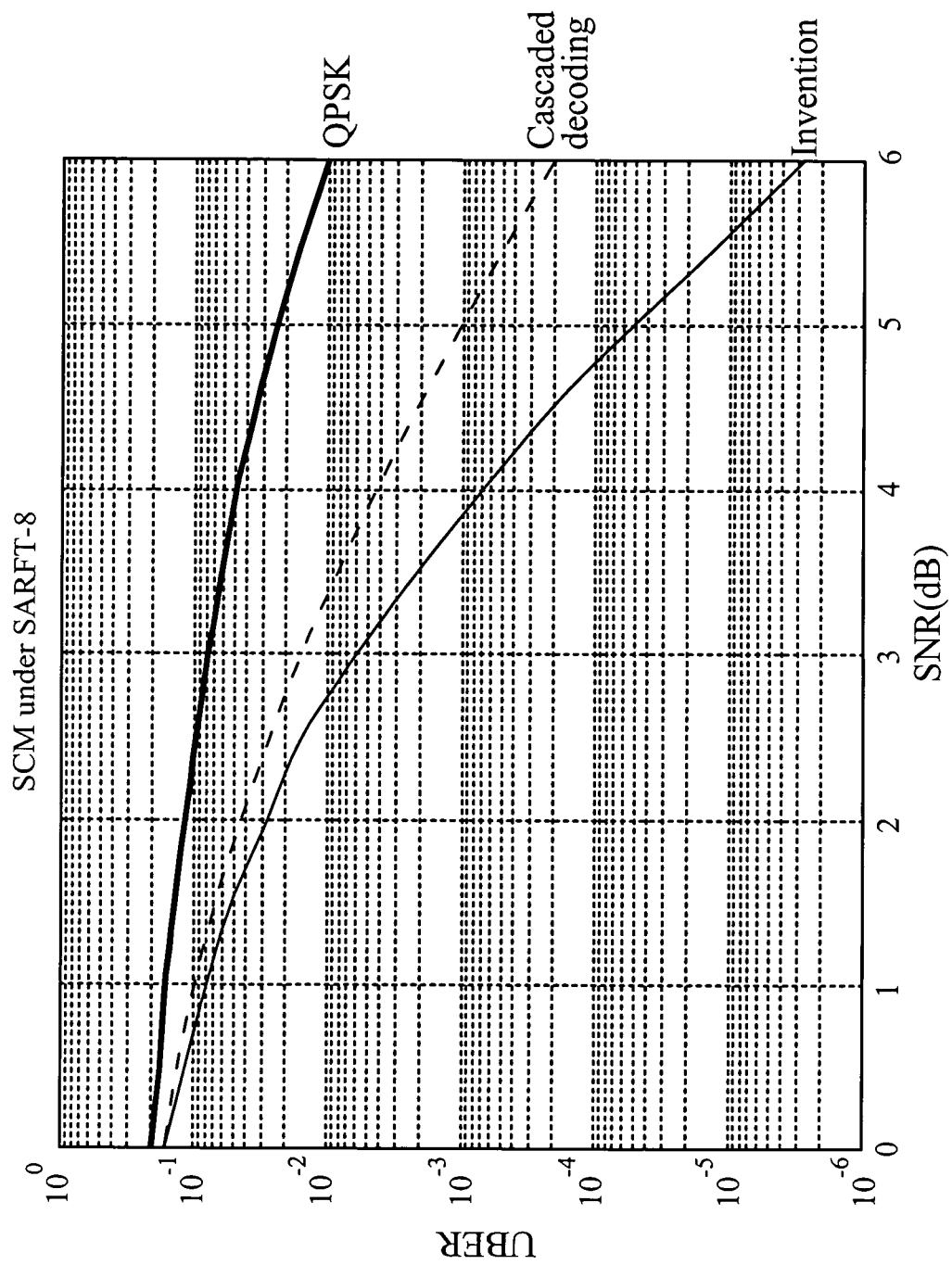
FIG. 7 a schematic graph of a further simulation result in accordance with the invention.

FIG. 7 is a schematic graph of a further simulation result in accordance with the invention, which is operated under SARFT-8 channel at single carrier mode and typical QPSK modulation scheme with cascaded decoding. In FIG. 5, the vertical axis denotes uncoded bit error rate (UBER), and the horizontal axis denotes signal to noise ratio (SNR). The cascaded decoding dash line is a simulation result of a technology that is disclosed in U.S. application Ser. No. 12/585,805, entitled "A decoding System for LDPC Code Concatenated with 4QAM-NR Code" filed Oct. 25, 2009. The parameters of the SARFT-8 channel used in simulation are shown in Table 1 as attached below.

TABLE 1

| Tap number | 1 | 2 | 3 | 4 | 5 | 6 |
|---|---|---|---|---|---|---|
| Tap delay (us) | −1.8 | 0.0 | 0.15 | 1.8 | 5.7 | 30 |
| Attenuation (dB) | −18 | 0 | −20 | −20 | −10 | 0 |
| Phase of taps (degree) | 0 | 0 | 0 | 0 | 0 | 0 |

Figure 8:
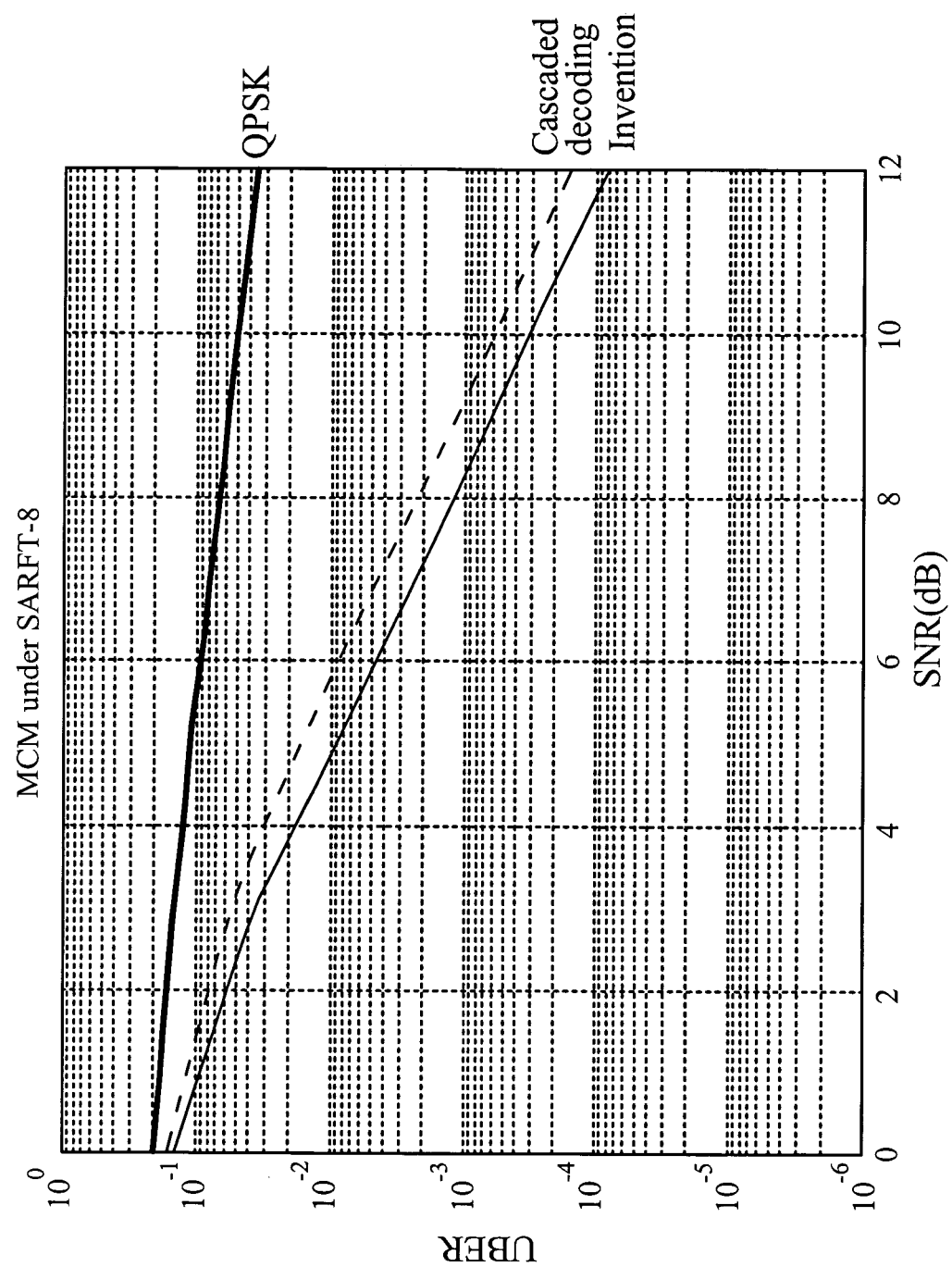
FIG. 8 a schematic graph of a further another simulation result in accordance with the invention

FIG. 8 is a schematic graph of a further another simulation result in accordance with the invention, which is operated under SARFT-8 channel at multi-carrier mode and typical QPSK modulation scheme with cascaded decoding. In FIG. 5, the vertical axis denotes uncoded bit error rate (UBER), and the horizontal axis denotes signal to noise ratio (SNR). The cascaded decoding dash line is a simulation result of a technology that is disclosed in U.S. application Ser. No. 12/585,805, entitled "A decoding System for LDPC Code Concatenated with 4QAM-NR Code" filed Oct. 25, 2009.

As shown in FIGS. 5, 6, and 7, the invention outperforms the other prior art in terms of bit error rate (BER) performance.

Without sacrificing the decoding performance, this invention proposes a simple way in calculating the LLRs for a general block code at general QAM modulation. This invention derives a generic equation to accordingly calculate the LLRs and proposes the corresponding hardware either for a linear or a nonlinear block code. Though this invention demonstrates design procedure and mathematical derivations by a short block code, i.e. the aforementioned NR code, the same conclusions are also true, irrespective of code properties and can be applied to other short or long block codes as well.

Although the present invention has been explained in relation to its preferred embodiment, it is to be understood that many other possible modifications and variations can be made without departing from the spirit and scope of the invention as hereinafter claimed.

What is claimed is:

1. A soft-in-soft-out (SISO) decoder for a general block code, which is used in a receiver of a general communication system, the soft-in-soft-out decoder comprising:
    a source bit generator which generates k guessed source bits, where k is a positive integer;
    a channel encoder which is connected to the source bit generator in order to generate an n-bit channel codeword based on the k guessed source bits, where n is a positive integer;
    a QAM symbol mapper which is connected to the channel encoder in order to generate a locally generated symbol sequence comprising m consecutive QAM symbols based on the n-bit channel codeword, where m is a positive integer;
    a correlator which is connected to the QAM symbol mapper in order to receive a symbol sequence, a channel state information sequence, and a locally generated symbol sequence provided by the QAM symbol mapper to calculate a correlation associated with the received symbol sequence based on the received symbol sequence, the channel state information, and the locally generated symbol sequence; and
    a log-likelihood ratio calculator which is connected to the source bit generator and the correlator in order to calculate the required log-likelihood ratios associated with all coded bits corresponding to the received symbol sequence.

2. The decoder as claimed in claim 1, wherein the correlator comprises:
    m complex conjugate units, where an m'-th complex conjugate unit receives an m'-th component of the received symbol sequence and performs an operation of complex conjugate on the m'-th component, where m, m' are positive integers, and $1 \leq m' \leq m$;
    m first multipliers, where an m'-th first multiplier receives an output of the m'-th complex conjugate unit and an m'-th component of the locally generated symbol sequence and multiplies the output by the m'-th component;
    m real number extractors, where an m'-th real number extractor is connected to the m'-th first multiplier in order to perform an operation of extraction of real number on the output of the m'-th first multiplier;
    m second multipliers, where an m'-th second multiplier is connected to the m'-th real number extractor in order to receive an m'-th component of the channel state information sequence for performing a multiplication operation; and
    an integrator which is connected to the m second multipliers in order to perform an addition operation on the output of the m second multipliers to thereby generate the correlation of symbol.

3. The decoder as claimed in claim 2, wherein the log-likelihood ratio (LLR) comprises k sub-LLR calculators, where a k'-th sub-LLR calculator includes:
    a k'-th demultiplexer which is connected to the source bit generator and the correlator in order to output the correlation corresponding to a k'-th source bit, where k, k' are positive integers, and $1 \leq k' \leq k$;
    a k'-th first maximum searcher which is connected to a first output terminal of the k'-th demultiplexer in order to search a maximum in the correlation;
    a k'-th first register which is connected to the k'-th first maximum searcher in order to temporarily store an output of the k'-th first maximum searcher;
    a k'-th second maximum searcher is connected to a second output terminal of the k'-th demultiplexer in order to search a maximum in the correlation;
    a k'-th second register which is connected to the k'-th second maximum searcher in order to temporarily store an output of the k'-th second maximum searcher; and
    a k'-th subtractor which is connected to the k'-th first register and the k'-th second register in order to subtract an output of the k'-th first register from an output of the k'-th second register to thereby generate a k'-th log-likelihood ratio.

4. The decoder as claimed in claim 3, wherein the block code is a linear block code or a nonlinear block code.

5. The decoder as claimed in claim 4, wherein the channel encoder is a Nordstrom-Robinson (NR) code encoder.

6. The decoder as claimed in claim 1, wherein the QAM symbol mapper is a constant amplitude QAM symbol mapper.

7. The decoder as claimed in claim 1, wherein the QAM symbol mapper is a 4QAM symbol mapper.

8. A soft-in-soft-out (SISO) decoder for a general block code, which is used in a receiver of a general communication system, the soft-in-soft-out decoder comprising:
    a source bit generator which generates k guessed source bits, where k is a positive integer;
    a channel encoder which is connected to the source bit generator in order to generate an n-bit channel codeword based on the k guessed source bits, where n is a positive integer;
    a QAM symbol mapper which is connected to the channel encoder in order to generate a locally generated symbol sequence comprising m consecutive QAM symbols based on the n-bit channel codeword, where m is a positive integer;
    a distance calculator which is connected to the QAM symbol mapper in order to receive a symbol sequence, a channel state information sequence, and a locally generated symbol sequence provided by the QAM symbol mapper to calculate a distance associated with the received symbol sequence based on the received symbol sequence, the channel state information sequence, and the locally generated symbol sequence; and a log-likelihood ratio calculator which is connected to the source bit generator and the distance calculator in order to calculate the required log-likelihood ratios associated with all coded bits corresponding to the received symbol sequence.

9. The decoder as claimed in claim 8, wherein the log-likelihood ratio (LLR) comprises k sub-LLR calculators, where a k'-th sub-LLR calculator includes:
a k'-th demultiplexer which is connected to the source bit generator and the correlator in order to output the correlation corresponding to a k'-th source bit, where k, k' are positive integers, and $1 \leq k' \leq k$;
a k'-th first minimum searcher which is connected to a first output terminal of the k'-th demultiplexer in order to search a minimum in the distance;
a k'-th first register which is connected to the k'-th first minimum searcher in order to temporarily store an output of the k'-th first minimum searcher;
a k'-th second minimum searcher is connected to a second output terminal of the k'-th demultiplexer in order to search a minimum in the distance;
a k'-th second register which is connected to the k'-th second minimum searcher in order to temporarily store an output of the k'-th second minimum searcher; and
a k'-th subtractor which is connected to the k'-th first register and the k'-th second register in order to subtract an output of the k'-th first register from an output of the k'-th second register to thereby generate a k'-th log-likelihood ratio.

10. The decoder as claimed in claim 9, wherein the block code is a linear block code or a nonlinear block code.

11. The decoder as claimed in claim 10, wherein the channel encoder is a Nordstrom-Robinson (NR) code encoder.

12. The decoder as claimed in claim 8, wherein the QAM symbol mapper is a constant amplitude QAM symbol mapper.

13. The decoder as claimed in claim 8, wherein the QAM symbol mapper is a 4QAM symbol mapper.

14. A soft-in-soft-out (SISO) decoder for a general block code, which is used in a receiver of a general communication system, the soft-in-soft-out decoder comprising:
a source bit generator which generates k guessed source bits, where k is a positive integer;
a correlator which receives a symbol sequence, a channel state information sequence, and a locally generated symbol sequence corresponding to the k guessed source bits to calculate a correlation associated with the received symbol sequence based on the received symbol sequence, the channel state information sequence, and the locally generated symbol sequence; and
a log-likelihood ratio calculator which is connected to the source bit generator and the correlator in order to calculate the required log-likelihood ratios associated with all coded bits corresponding to the received symbol sequence,
wherein a log-likelihood ratio $LLR(b_i)$ is approximated by following equations:

$$LLR(b_i) \approx \operatorname*{Min}_{C \in C_i^0} \xi^{(i,0)} - \operatorname*{Min}_{C \in C_i^1} \xi^{(i,1)}$$
$$= \frac{1}{\sigma^2} \{D_{mp}^{(i,1)} - D_{mp}^{(i,0)}\}$$
$$= D_{md}^{(i,0)} - D_{md}^{(i,1)},$$

where $b_i$ denotes an i-th source bit, $B \equiv (b_1, b_2, b_3, \ldots, b_8)$ denotes a source bit sequence, $b_i = b$ and is zero or one, $$D_{md}^{(i,b)} \equiv \operatorname*{Min}_{C \in C_i^b} \xi^{(i,b)},$$

$$D_{mp}^{(i,b)} \equiv \operatorname*{Max}_{C \in C_i^b} \left[ \sum_{n=1}^{8} |H_n| \cdot \operatorname{Re}(\tilde{z}_n \cdot x_n^{(i,b)}) \right],$$

$C \equiv R(B)$ denotes a channel codeword obtained by mapping the source bit sequence B through a mapping function R of NR coding, $C_i^b \equiv \{C | B = R^{-1}(C), b_i = b\}$, $R^{-1}$ denotes a de-mapping function of R, $$\xi^{(i,b)} \equiv \beta - \frac{1}{\sigma^2} \sum_{n=1}^{8} |H_n| \cdot \operatorname{Re}(\tilde{z}_n \cdot x_n^{(i,b)}),$$

$\beta$ is a non-zero constant, $\tilde{z}_n \equiv z_n^* \cdot e^{j \angle H_n}$ denotes a received phase-equalized symbol, $z_n \equiv x_n \cdot H_n + n_n$ denotes a component of a received symbol sequence $Z \equiv (z_1, z_2, z_3, \ldots, z_8)$, $H_n$ denotes a component of a channel state information sequence $H \equiv (H_1, H_2, H_3, \ldots, H_8)$ which denotes an estimated channel gain sequence associated with symbols of the received symbol sequence Z, $x_n$ denotes a component of a transmitted symbol sequence $X \equiv (x_1, x_2, x_3, \ldots, x_8)$ obtained by mapping the channel codeword C through a mapping function of 4-QAM modulation, and $n_n$ denotes a component of independent Gaussian noises with zero mean and a variance $\sigma^2$.

15. The decoder as claimed in claim 14, further comprising:
a channel encoder which is connected to the source bit generator in order to generate an n-bit channel codeword based on the k guessed source bits, where n is a positive integer; and
a Quadrature Amplitude Modulation (QAM) symbol mapper which is connected to the channel encoder in order to map the n-bit channel codeword into a QAM symbol sequence to become the transmitted symbol sequence.

16. A soft-in-soft-out (SISO) decoder for a general block code, which is used in a receiver of a general communication system, the soft-in-soft-out decoder comprising:
a source bit generator which generates k guessed source bits, where k is a positive integer;
a distance calculator which receives a symbol sequence, a channel state information sequence, and a locally generated symbol sequence corresponding to the k guessed source bits to calculate a distance associated with the received symbol sequence based on the received symbol sequence, the channel state information sequence, and the locally generated symbol sequence; and
a log-likelihood ratio calculator which is connected to the source bit generator and the distance calculator in order to calculate the required log-likelihood ratios associated with all coded bits corresponding to the received symbol sequence,
wherein a log-likelihood ratio $LLR(b_i)$ is approximated by following equations:

$$LLR(b_i) \approx \operatorname*{Min}_{C \in C_i^0} \xi^{(i,0)} - \operatorname*{Min}_{C \in C_i^1} \xi^{(i,1)}$$

$$= \frac{1}{\sigma^2}\{D_{mp}^{(i,1)} - D_{mp}^{(i,0)}\}$$
$$= D_{md}^{(i,0)} - D_{md}^{(i,1)},$$

where $b_i$ denotes ith source bit, $B \equiv (b_1, b_2, b_3, \ldots, b_8)$ denotes a source bit sequence, $b_i = b$ and is zero or one, $$D_{md}^{(i,b)} \equiv \min_{C \in C_i^0} \xi^{(i,b)},$$

$$D_{mp}^{(i,b)} \equiv \max_{C \in C_i^b}\left[\sum_{n=1}^{8} |H_n| \cdot \mathrm{Re}(\tilde{z}_n \cdot x_n^{(i,b)})\right],$$

$C \equiv R(B)$ denotes a channel codeword obtained by mapping the source bit sequence B through a mapping function R of NR coding, $C_i^b \equiv \{C|B=R^{-1}(C), b_i=b\}$, $R^{-1}$ denotes a de-mapping function of R, $$\xi^{(i,b)} \equiv \beta - \frac{1}{\sigma^2}\sum_{n=1}^{8}|H_n| \cdot \mathrm{Re}(\tilde{z}_n \cdot x_n^{(i,b)}),$$

$\beta$ is a non-zero constant, $\tilde{z}_n = z_n^* \cdot e^{j\angle H_n}$ denotes a received phase-equalized symbol, $z_n = x_n \cdot H_n + n_n$ denotes a component of a received symbol sequence $Z \equiv (z_1, z_2, z_3, \ldots, z_8)$, $H_n$ denotes a component of a channel state information sequence $H \equiv (H_1, H_2, H_3, \ldots, H_8)$ which denotes an estimated channel gain sequence associated with symbols of the received symbol sequence Z, $x_n$ denotes a component of a transmitted symbol sequence $X \equiv (x_1, x_2, x_3, \ldots, x_8)$ obtained by mapping the channel codeword C through a mapping function of 4-QAM modulation, and $n_n$ denotes a component of independent Gaussian noises with zero mean and variance $\sigma^2$.

17. The decoder as claimed in claim 15, further comprising:

a channel encoder which is connected to the source bit generator in order to generate an n-bit channel codeword based on the k guessed source bits, where n is a positive integer; and a QAM symbol mapper which is connected to the channel encoder in order to map the n-bit channel codeword into the locally generated symbol sequence.

* * * * *